United States Patent
Sasaki

(10) Patent No.: US 9,568,169 B2
(45) Date of Patent: Feb. 14, 2017

(54) ELECTRONIC CIRCUIT DEVICE AND METHOD FOR MANUFACTURING ELECTRONIC CIRCUIT DEVICE

(71) Applicant: Panasonic Intellectual Property Management Co., Ltd., Osaka (JP)

(72) Inventor: Koichi Sasaki, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 38 days.

(21) Appl. No.: 14/759,334

(22) PCT Filed: Dec. 13, 2013

(86) PCT No.: PCT/JP2013/007348
§ 371 (c)(1),
(2) Date: Jul. 6, 2015

(87) PCT Pub. No.: WO2014/118856
PCT Pub. Date: Aug. 7, 2014

(65) Prior Publication Data
US 2015/0338067 A1    Nov. 26, 2015

(30) Foreign Application Priority Data
Jan. 31, 2013   (JP) .................................. 2013-016587

(51) Int. Cl.
*F21V 15/01* (2006.01)
*F21V 19/00* (2006.01)
(Continued)

(52) U.S. Cl.
CPC ............. *F21V 15/01* (2013.01); *F21V 19/003* (2013.01); *F21V 33/00* (2013.01); *H01L 33/54* (2013.01);
(Continued)

(58) Field of Classification Search
CPC ........ F21V 15/01; F21V 19/003; F21V 33/00; H01L 33/54; H01L 33/52; H01L 33/56; H05K 3/284; H05K 2201/10106; H05K 2201/2018; Y10T 29/49147; F21Y 2115/10; F21K 9/00
See application file for complete search history.

(56) References Cited

U.S. PATENT DOCUMENTS 7,808,004 B2 * 10/2010 Sun ......................... B29C 33/40
257/113
7,889,421 B2 * 2/2011 Narendran ............ H01L 33/507
359/326
(Continued)

FOREIGN PATENT DOCUMENTS

JP        54-069063 A    6/1979
JP      2004-153526 A    5/2004
(Continued)

OTHER PUBLICATIONS

International Search Report for Application No. PCT/JP2013/007348 dated Feb. 10, 2014.

*Primary Examiner* — Peggy Neils
(74) *Attorney, Agent, or Firm* — Pearne & Gordon LLP

(57) ABSTRACT

In an electronic circuit device, a circuit board (40) is disposed in an inner case (10), a light emitting element (50) is mounted on a surface on the reverse side of the surface having the circuit board (40) mounted thereon, and a light emitting element (50) is sealed by injecting a translucent resin (60) into the inner case (10). The inner case (10) is provided with a cylindrical section (12) that surrounds the light emitting element (50), and it is configured such that the height of the translucent resin (60) injected into the cylindrical section (12) is more than the height of the translucent resin (60) injected to the outside of the cylindrical section (12).

8 Claims, 7 Drawing Sheets

(51) Int. Cl.
*F21V 33/00* (2006.01)
*H05K 3/28* (2006.01)
*H04B 1/034* (2006.01)
*H01L 33/54* (2010.01)

(52) U.S. Cl.
CPC .............. *H04B 1/034* (2013.01); *H05K 3/284* (2013.01); *H05K 2201/10106* (2013.01); *H05K 2201/2018* (2013.01); *Y10T 29/49147* (2015.01)

(56) References Cited

U.S. PATENT DOCUMENTS

| | | | |
|---|---|---|---|
| 8,035,121 B2 * | 10/2011 | Park | G02B 5/1876 |
| | | | 257/98 |
| 9,274,006 B2 * | 3/2016 | Nitobe | G01J 5/34 |
| 2004/0090737 A1 | 5/2004 | Shimura et al. | |
| 2005/0136852 A1 | 6/2005 | Nakagawa et al. | |
| 2006/0034084 A1 * | 2/2006 | Matsuura | H01L 33/507 |
| | | | 362/293 |
| 2013/0114195 A1 * | 5/2013 | Lee | H01H 13/83 |
| | | | 361/679.01 |
| 2014/0042478 A1 | 2/2014 | Hirono et al. | |

FOREIGN PATENT DOCUMENTS

| JP | 2005-179942 A | 7/2005 |
|---|---|---|
| JP | 2012-195371 A | 10/2012 |

* cited by examiner

ELECTRONIC CIRCUIT DEVICE AND METHOD FOR MANUFACTURING ELECTRONIC CIRCUIT DEVICE

TECHNICAL FIELD

The present invention relates to an electronic circuit apparatus with electronic parts including a light-emitting element sealed with a light-transmissive resin on a circuit board, and more particularly, to an electronic key used for a remote control system that opens and closes a door.

BACKGROUND ART

Conventionally, in electronic circuit apparatuses such as electronic keys used, for example, for smart key-less entry, the case of each apparatus is partially made of a transparent resin and the light emitted from an LED that indicates an operating state of the electronic key passes through this resin (e.g., see Patent Literature (hereinafter, referred to as "PTL") 1. In addition, electronic keys in recent years are required to be shock-resistant, water-resistant and thinner, and card-type electronic keys each formed by sealing a circuit board with a thermosetting resin have been developed (e.g., see PTL 2).

CITATION LIST

Patent Literature

PTL 1
Japanese Patent Application Laid-Open No. 2004-153526
PTL 2
Japanese Patent Application Laid-Open No. 2005-179942

SUMMARY OF INVENTION

Technical Problem

However, when a light-emitting element on a circuit board is sealed with a light-transmissive resin, the amount of injected resin varies from one product to another due to manufacturing errors. For this reason, there is concern that the height of light-transmissive resin existing in an irradiation range of the light-emitting element varies from one product to another, so that the quality of brightness may not be maintained.

An object of the present invention is to provide an electronic circuit apparatus capable of keeping uniform the height of light-transmissive resin with which a light-emitting element is sealed in an irradiation direction of the light-emitting element, regardless of products and maintaining the quality of the light-emitting element.

Solution to Problem

An electronic circuit apparatus according to an aspect of the present invention includes: an upper case and a lower case that form a case; a circuit board mounted on the lower case; an inner case including a hollow frame body that surrounds the circuit board, the inner case being configured to hermitically seal an inside of the inner case by bonding a top surface and an undersurface of the frame body to the upper case and the lower case, respectively; an electronic part including a light-emitting element that is provided on a surface of the circuit board opposite to a mounting surface of the circuit board and that emits light at least to outside; and a light-transmissive resin that is injected into the frame body of the inner case to seal the electronic part and that allows irradiating light of the light-emitting element to pass through the light-transmissive resin to outside, in which the inner case includes a cylindrical part that surrounds the light-emitting element in the frame body and a height of the light-transmissive resin injected into the cylindrical part is greater than a height of the light-transmissive resin injected into a region outside the cylindrical part.

Advantageous Effects of Invention

According to the present invention, a light-transmissive resin injected from the cylindrical part is fixed at the height of the top end of the cylindrical part after overflowing from the cylindrical part until the electronic part is sealed with the light-transmissive resin, which makes it possible to keep the quality of the light-emitting element constant without varying from one product to another.

DESCRIPTION OF EMBODIMENT

Hereinafter, a description will be given of an electronic key for smart key-less entry as an electronic circuit apparatus according to an embodiment of the present invention with reference to the accompanying drawings.

Figure 1:
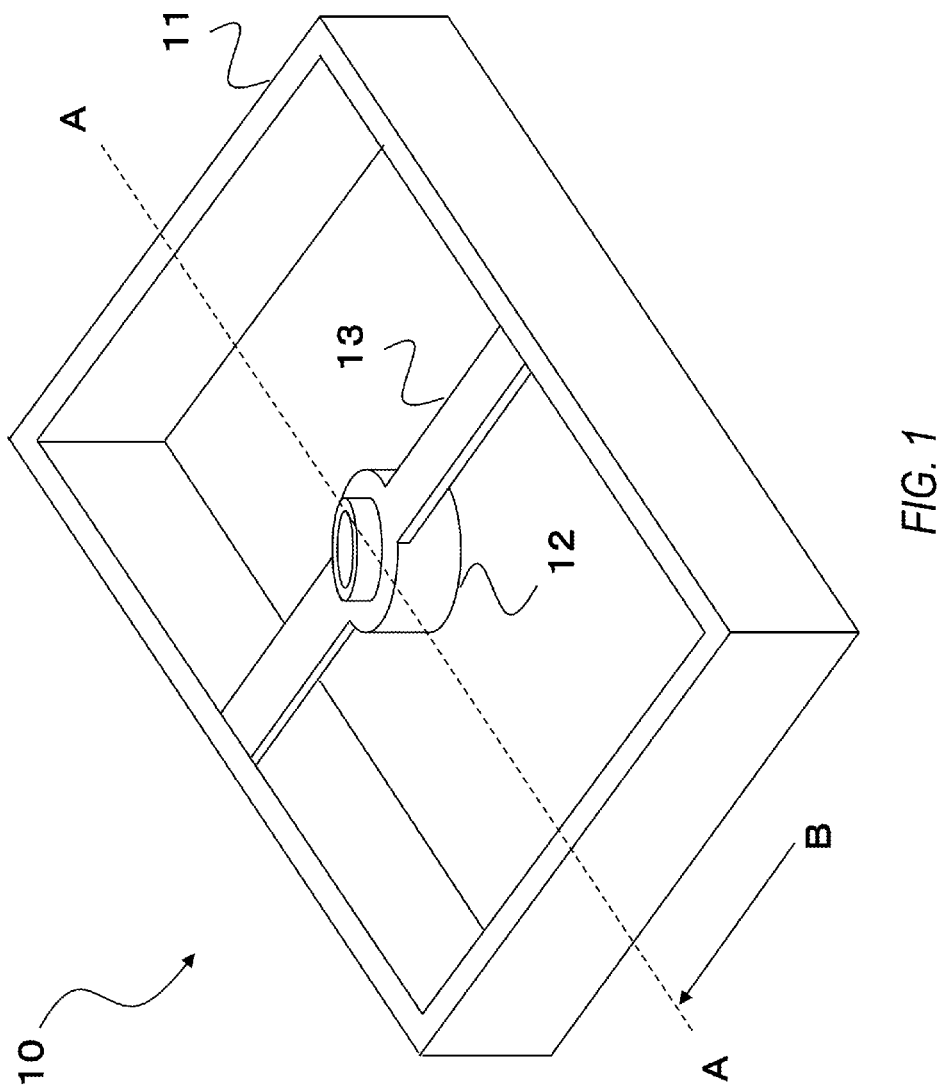
FIG. 1 is a perspective view of an inner case of an electronic key according to an embodiment of the present invention.

FIG. 1 is a perspective view of an inner case of an electronic key according to the present embodiment. Inner case 10 is provided inside a case of the electronic key. Inner case 10 includes hollow frame body 11 with open top and bottom. A circuit board mounted with an electronic circuit is disposed in this frame body 11. A thermosetting light-transmissive resin is injected into this frame body 11 and the circuit board is sealed with this resin. Inner case 10 also includes hollow cylindrical part 12 that surrounds a light-emitting element. Cylindrical part 12 is reinforced by rib part 13 that extends from side walls of frame body 11.

Figure 2:
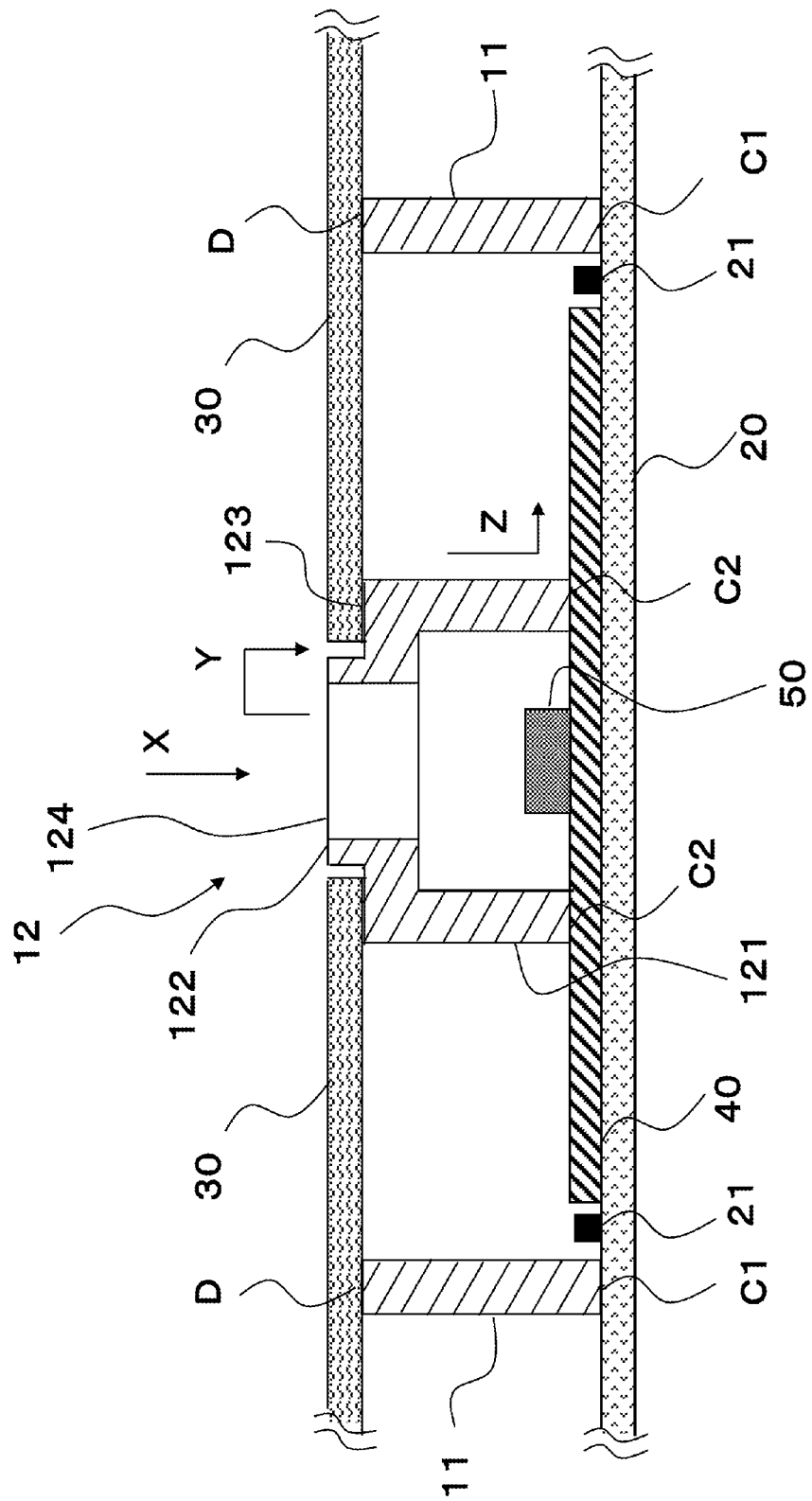
FIG. 2 is a cross-sectional view taken along line A-A in FIG. 1 of the electronic key before resin injection when viewed from the direction of arrow B.

FIG. 2 is a cross-sectional view along line A-A in FIG. 1 of the electronic key before injecting resin when viewed from the direction of arrow B.

As shown in FIG. 2, inner case 10 is hermetically sealed by lower case 20 and upper case 30 which make up the case. That is, an undersurface of frame body 11 is bonded to a C1 part of lower case 20 and a top surface of frame body 11 is bonded to a D part of upper case 30. For this reason, even when resin is injected into frame body 11, the resin does not leak out of frame body 11 from the C1 part and D part. Positioning pins 21 are provided on a top surface of lower case 20. Frame body 11 is disposed outside positioning pins 21. On the other hand, circuit board 40 is disposed inside positioning pins 21. Various electronic parts including light-emitting element 50 are mounted on the top surface of circuit board 40. Here, light-emitting element 50 is constructed of, for example, an LED. The undersurface of circuit board 40 is placed on the top surface of lower case 20.

As shown in FIG. 2, cylindrical part 12 is formed into a convex shape and includes cylindrical body 121 and protruding part 122. Cylindrical body 121 has mounting surface 123 that extends inward from a top end of cylindrical body 121. The height of mounting surface 123 is equal to the height of frame body 11. A circumferential part of the undersurface of upper case 30 around an opening formed therein is placed on this mounting surface 123.

Protruding part 122 protrudes upward from an inner proximal end of mounting surface 123. Light-transmissive resin is injected into inlet 124 of protruding part 122 from an X direction in FIG. 2. Light-emitting element 50 is surrounded by cylindrical part 12. The undersurface of cylindrical body 121 is bonded to a C2 part of circuit board 40. For this reason, the resin injected into cylindrical part 12 does not leak out of cylindrical part 12 from the C2 part.

When the resin is injected into cylindrical part 12 from the X direction in FIG. 2, the resin is accumulated in a space of cylindrical body 121 and the resin is further accumulated in the space of inlet 124. The resin reaches the top end of protruding part 122. When the injection of the resin is continued, the resin overflows from the top end of protruding part 122 over mounting surface 123 as shown by a Y direction. The resin oozes from a gap between mounting surface 123 and upper case 30 and flows along an outer wall surface of cylindrical body 121 in a Z direction. For this reason, when the injection of resin in the X direction is continued, the resin is gradually accumulated in frame body 11 of inner case 10 from the lower case 20 side. The electronic circuit on circuit board 40 is sealed with the accumulated resin.

The injection of the resin may be continued at least until this electronic circuit is sealed. In the case of a thin electronic key such as a card key, since the distance between the top end of the electronic circuit on circuit board 40 and upper case 30 is designed to be as short as possible, this has substantially the same meaning as injecting the resin until the resin substantially fills the inner space of frame body 11.

The above-described electronic key is manufactured in the following steps.

(1) Step of mounting circuit board 40 on lower case 20 using positioning pins 21
(2) Step of applying adhesive to C1 part of lower case 20
(3) Step of placing and bonding inner case 10 at C1 part and hermetically sealing a gap between frame body 11 and lower case 20 (gap at C1 part)
(4) Step of injecting a light-transmissive resin into cylindrical part 12 from X direction, filling frame body 11 of inner case 10 with the light-transmissive resin and sealing electronic parts including light-emitting element 50 of circuit board 40
(5) Step of applying an adhesive to D part of top surface of frame body 11 of inner case 10
(6) Step of placing and bonding upper case 30 at D part and hermetically sealing a gap between frame body 11 and upper case 30 (gap at D part)
(7) Step of heating electronic key and thermal curing the injected light-transmissive resin By following steps (4) to (6) in that order, the light-transmissive resin can be injected while visually checking the degree of filling by visual observation or using a surveillance camera or the like, and anomaly or failure during manufacturing can thereby be easily checked.

Note that steps (5) and (6) may be executed before step (4). However, in this case, if the resin overflows from the top end of protruding part 122 in the Y direction, the resin flows from the gap between mounting surface 123 and upper case 30, and so the injection speed is slower than in the case following the order of steps (4) to (6) where upper case 30 is not placed before charging of the resin.

Note that step (2) may be omitted by applying an adhesive to the undersurface side of frame body 11. Step (5) may be omitted by applying an adhesive to the D part of the undersurface of upper case 30.

The electronic key is created after injecting the resin in the above-described steps.

Figure 3:
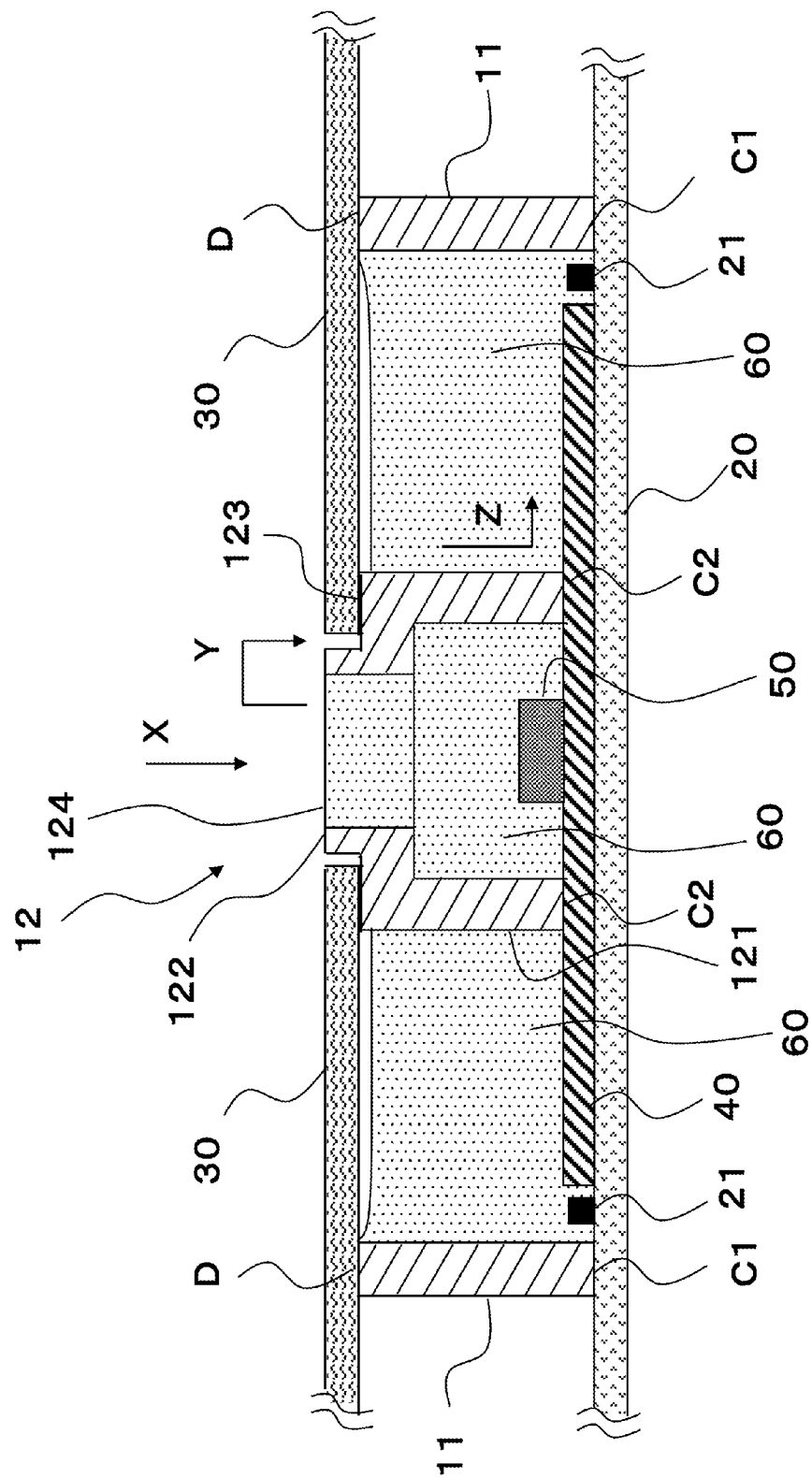
FIG. 3 is a cross-sectional view taken along line A-A in FIG. 1 of the electronic key after resin injection when viewed from the direction of arrow B.

FIG. 3 is a cross-sectional view along line A-A in FIG. 1 of the electronic key after injecting a resin when viewed from the direction of arrow B.

As shown in FIG. 3, the inside of cylindrical part 12 is sealed with light-transmissive resin 60 up to the top end of protruding part 122 and the space in frame body 11 other than cylindrical part 12 is sealed with the resin up to substantially the top end of frame body 11. For example, an epoxy resin is used as this light-transmissive resin 60. Light-transmissive resin 60 may be transparent or semi-transparent. Any type of light-transmissive resin may be used as long as it has at least a degree of transmissivity that allows irradiating light of light-emitting element 50 to be visually identified from outside. The irradiating light of light-emitting element 50 passes through light-transmissive resin 60 inside cylindrical part 12 and is radiated to the outside.

Here, even when the amount of injection of light-transmissive resin 60 fluctuates due to a manufacturing error, the height of light-transmissive resin 60 filling cylindrical part 12 is up to the top end of protruding part 122, which is constant. This prevents optical characteristics of light-transmissive resin 60 as a thin-film from varying from one product to another and thereby allows the quality of outward radiation performance of light-emitting element 50 to be kept constant. As is also seen from FIG. 3, the height of light-transmissive resin 60 filling a region inside cylindrical part 12 is greater than the height of light-transmissive resin 60 filling a region outside cylindrical part 12.

(Variation 1)

Next, variation 1 of the present embodiment will be described using the accompanying drawings.

Figure 4:
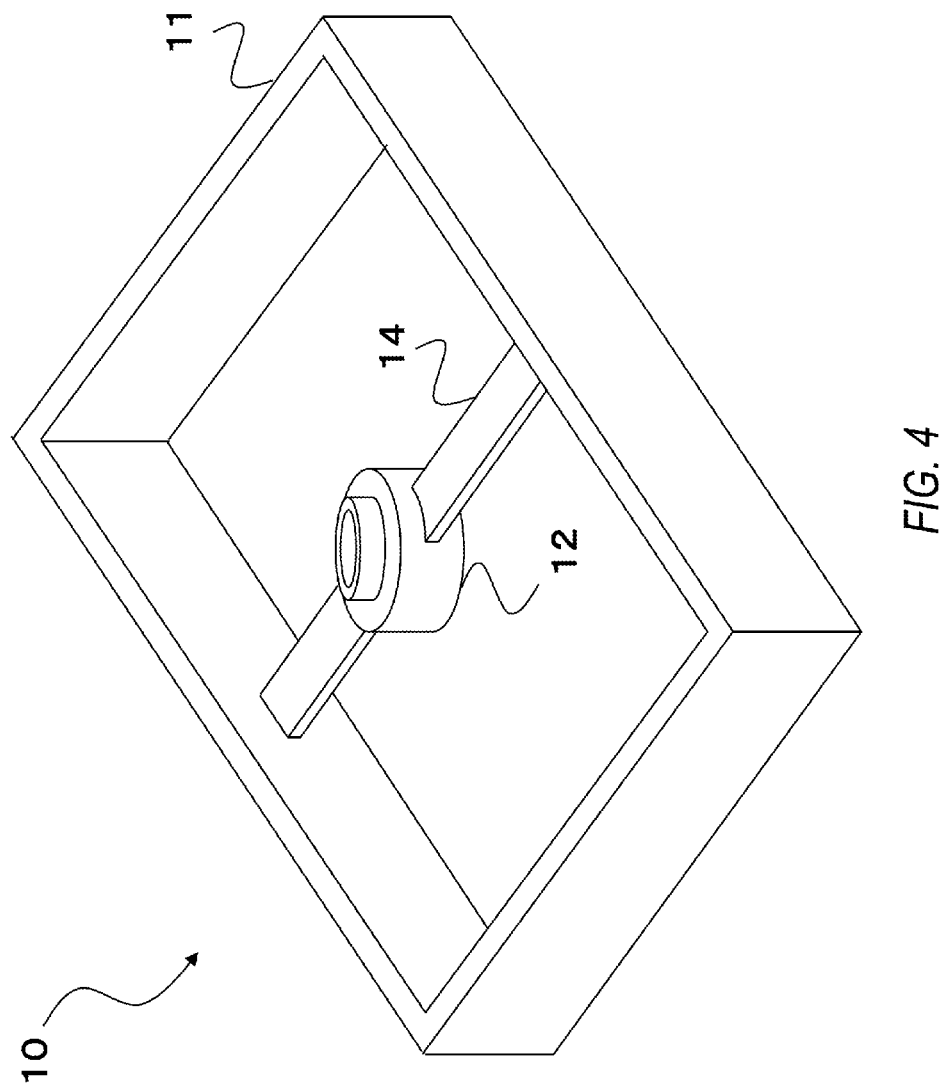
FIG. 4 is a perspective view of an inner case according to variation 1 in the case of FIG. 1.
Figure 5:
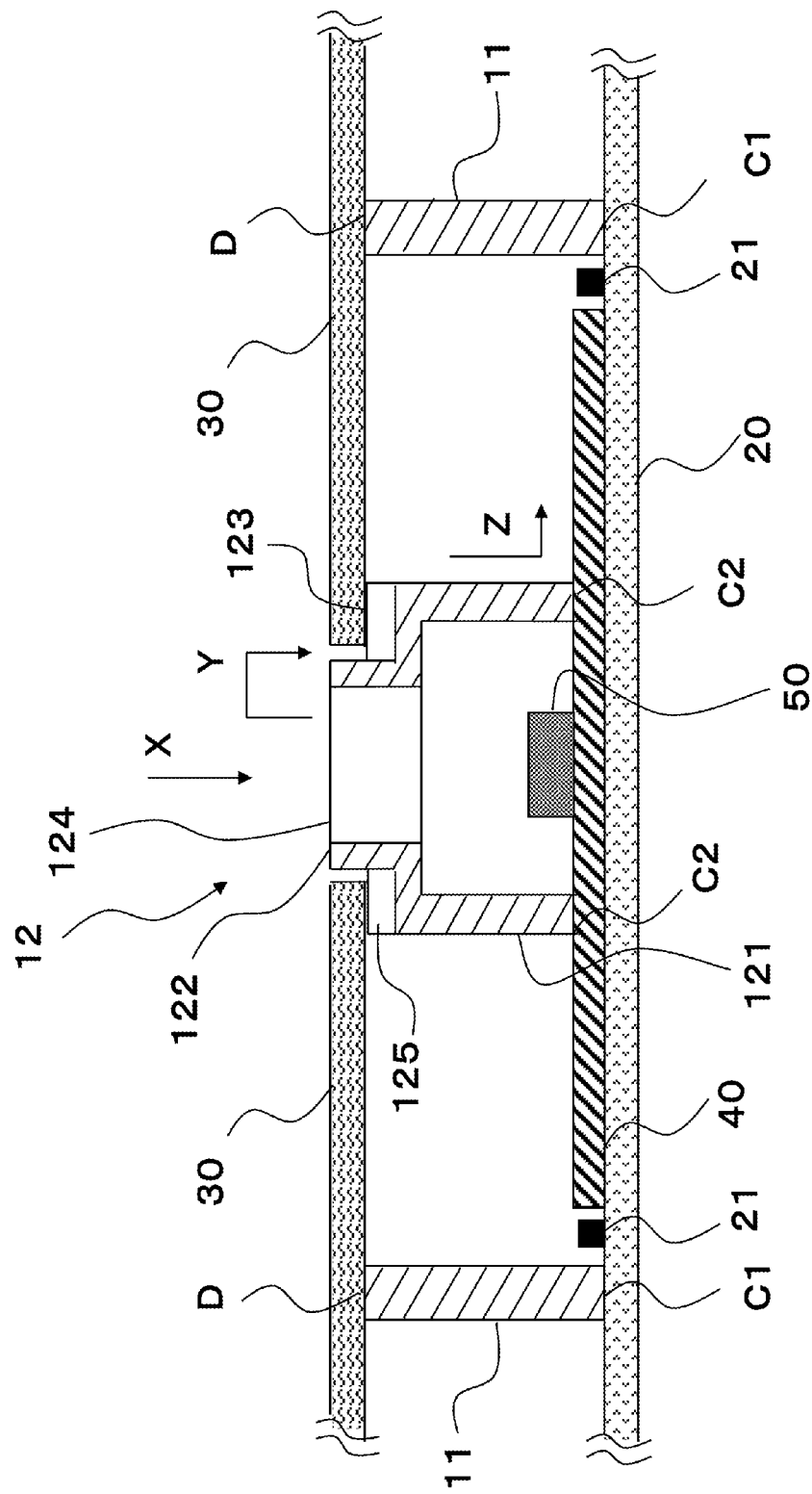
FIG. 5 is a cross-sectional view of the electronic key according to variation 1 in the case of FIG. 2.
Figure 6:
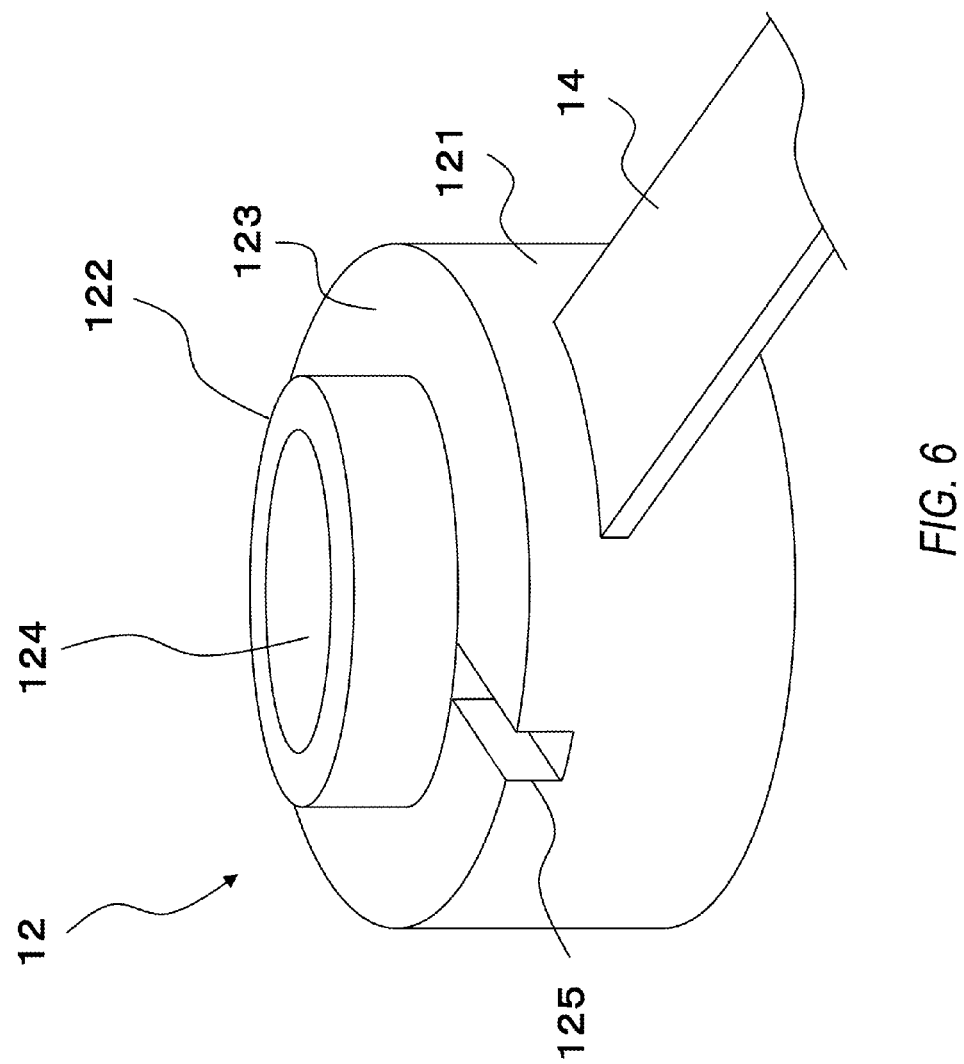
FIG. 6 is an enlarged perspective view of a cylindrical part in FIG. 5.

FIG. 4 is a perspective view of an inner case according to variation 1 in the case of FIG. 1. FIG. 5 is a cross-sectional view of an electronic key according to the variation in the case of FIG. 2. FIG. 6 is an enlarged perspective view of the cylindrical part in FIG. 5.

As shown in FIG. 4, the location of rib part 14 in inner case 10 according to this variation is different from that in FIG. 1. That is, while rib part 13 in FIG. 1 is disposed at the same height as that of mounting surface 123, rib part 14 in this variation is disposed to be lower than mounting surface 123. This variation increases the effect when providing a notch in cylindrical part 12. That is, this is a case as shown in FIG. 5 and FIG. 6 where notched part 125 is provided on the top surface of cylindrical body 121 of cylindrical part 12 (mounting surface 123 and outside wall of cylindrical body 121). In this case, even if upper case 30 is bonded to frame body 11 of inner case 10 before injecting light-transmissive resin 60 (in other words, steps (5) and (6) are executed before step (4)), the resin smoothly flows in the Z direction via notched part 125 when the resin overflows from the top end of protruding part 122 in the Y direction by injection of light-transmissive resin 60. Thus, a delay in the resin filling speed can be reduced compared to the case where steps (4) to (6) are executed in that order. In this way, it is possible to improve the degree of freedom of manufacturing. Since rib part 14 is placed lower than mounting surface 123 in this variation, the region where notched part 125 can be provided can cover the full range of mounting surface 123. For this reason, for example, the degree of freedom of design improves when a plurality of notched parts 125 are provided or when a plurality of notched parts 125 are provided so that adjacent angles become uniform.

(Variation 2)

Next, variation 2 of the present embodiment will be described using the accompanying drawings.

Figure 7:
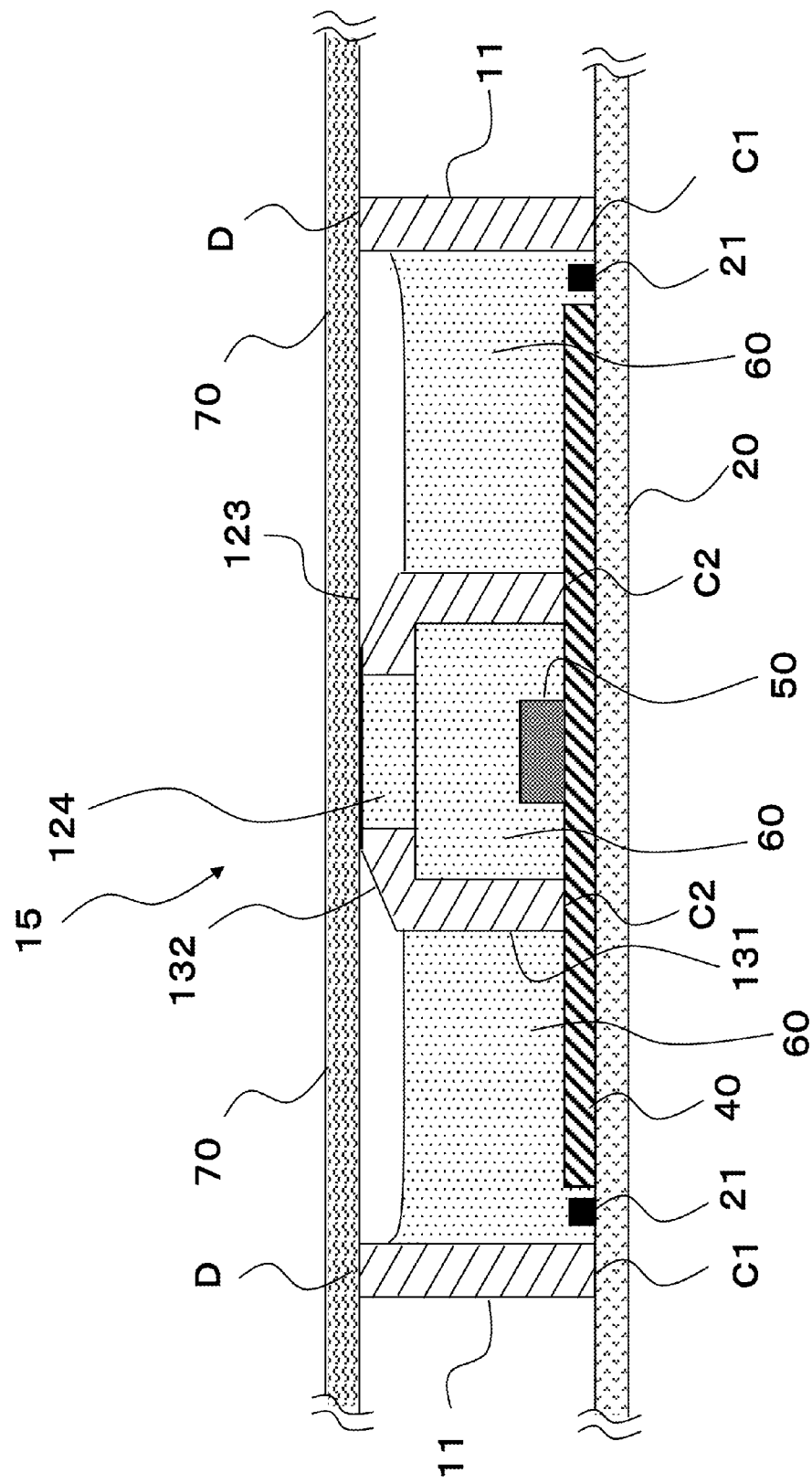
FIG. 7 is a cross-sectional view of an electronic key according to variation 2 in the case of FIG. 2.

FIG. 7 is a cross-sectional view of an electronic key according to variation 2 to FIG. 2. As shown in FIG. 7, cylindrical part 15 has a convex interior and includes cylindrical body 131 and protruding part 132. Protruding part 132 includes mounting surface 123 at the top end and a section between cylindrical body 131 and mounting surface 123 is formed into a tapered shape. Cylindrical part 15 is formed to be lower than cylindrical part 12 of the above embodiment and variation 1. This allows the amount of light-transmissive resin 60 to be reduced.

Upper case 70 is formed of, for example, light-transmissive resin 60 and placed on mounting surface 123. This eliminates the need for providing an opening in upper case 70 and can thereby reduce man-hours for providing the opening.

The electronic key according to this modification may be manufactured using a procedure following steps (1) to (7).

As described so far, according to the electronic key of the present embodiment and variations, the height of light-transmissive resin 60 injected from cylindrical part 12 or 15 is kept constant at the height of the top end of the cylindrical part 12 or 15 after the resin overflows from cylindrical part 12 or 15 until the electronic part on circuit board 40 is sealed with the resin. Thus, it is possible to keep the quality of the light-emitting element 50 constant without variation in quality among the products.

The present embodiment has been described using an electronic key as an example of the electronic circuit apparatus of the present invention, but the present invention is also applicable to an electronic circuit apparatus that emits light to the outside using light-emitting element 50.

The disclosure of Japanese Patent Application No. 2013-016587, filed on Jan. 31, 2013, including the specification, drawings and abstract is incorporated herein by reference in its entirety.

INDUSTRIAL APPLICABILITY

The electronic circuit apparatus according to the present invention is useful as an electronic circuit apparatus that indicates the state of the electronic circuit using a light-emitting element such as an electronic key for smart key-less entry.

REFERENCE SIGNS LIST

10 Inner case
11 Frame body
12, 15 Cylindrical part
13, 14 Rib part
20 Lower case
21 Positioning pin
30, 70 Upper case
40 Circuit board
50 Light-emitting element
60 Light-transmissive resin
121, 131 Cylindrical body
122, 132 Protruding part
123 Mounting surface
124 Inlet
125 Notched part

The invention claimed is:

1. An electronic circuit apparatus comprising:
an upper case and a lower case that form a case;
a circuit board mounted on the lower case;
an inner case including a hollow frame body that surrounds the circuit board, the inner case being configured to hermitically seal an inside of the inner case by bonding a top surface and an undersurface of the frame body to the upper case and the lower case, respectively;
an electronic part including a light-emitting element that is provided on a surface of the circuit board opposite to a mounting surface of the circuit board and that emits light at least to outside; and
a light-transmissive resin that is injected into the frame body of the inner case to seal the electronic part and that allows irradiating light of the light-emitting element to pass through the light-transmissive resin to outside, wherein
the inner case includes a cylindrical part that surrounds the light-emitting element in the frame body and a height of the light-transmissive resin injected into the cylindrical part is greater than a height of the light-transmissive resin injected into a region outside the cylindrical part.

2. The electronic circuit apparatus according to claim 1, wherein the height of the light-transmissive resin is a height of a top end of the cylindrical part.

3. The electronic circuit apparatus according to claim 2, wherein the cylindrical part is formed into a protruding shape including a cylindrical body and a protruding part that protrudes from a top surface of the cylindrical body, and a circumferential part of the upper case around an opening provided in the upper case is mounted on the top surface of the cylindrical body.

4. The electronic circuit apparatus according to claim 3, wherein the cylindrical body includes a notched part that connects an inner space and an outer space of the inner case.

5. The electronic circuit apparatus according to claim 1, wherein the inner case further includes a rib part that reinforces the cylindrical part.

6. The electronic circuit apparatus according to claim 5, wherein the height of a top surface of the rib part is lower than the height of the cylindrical body of the cylindrical part.

7. The electronic circuit apparatus according to claim 5, wherein the height of the top surface of the rib part is equal to the height of the cylindrical body of the cylindrical part.

8. A method of manufacturing an electronic circuit apparatus, the method comprising:
mounting a circuit board on a lower case that partially forms a case;
mounting a frame body of an inner case on the lower case to surround the circuit board, covering a light-emitting element provided on a top surface side of the circuit board with a cylindrical part provided in the inner case, and bonding undersurfaces of the frame body and the cylindrical part to a top surface of the lower case;

injecting a light-transmissive resin from an inlet of the cylindrical part that protrudes to a position higher than a top surface of the frame body and immersing an electronic circuit of the circuit board including the light-emitting element;
mounting the upper case that partially forms the case on the top surface of the frame body and a top surface of the cylindrical body of the cylindrical part, and bonding the top surface of the frame body to the undersurface of the upper case; and
thermal curing the light-transmissive resin.

\* \* \* \* \*